United States Patent [19]

Berrigan et al.

[11] Patent Number: 4,906,939
[45] Date of Patent: Mar. 6, 1990

[54] DEVICE FOR AUTOMATICALLY ASCERTAINING CAPACITOR BREAKDOWN VOLTAGE

[75] Inventors: Paul J. Berrigan, Circleville, Ohio; Michael J. Brennan, Jr., Wilmington, Del.

[73] Assignee: E. I. Du Pont de Nemours and Company, Wilmington, Del.

[21] Appl. No.: 285,535

[22] Filed: Dec. 16, 1988

[51] Int. Cl.[4] .................... G01R 31/16; G01R 31/12
[52] U.S. Cl. ................... 324/548; 324/158 F; 324/658
[58] Field of Search ............... 324/60 C, 60 R, 57 R, 324/548, 73 R, 158 F; 209/574

[56] References Cited

U.S. PATENT DOCUMENTS

| | | | |
|---|---|---|---|
| 2,925,553 | 2/1960 | Shillington | 324/548 |
| 3,042,860 | 7/1962 | Shillington | 324/584 X |
| 3,281,675 | 10/1966 | Shillington | 324/548 |
| 3,465,403 | 9/1969 | Brown | 29/25.42 |
| 3,508,146 | 4/1970 | Jackson | 324/60 |
| 3,518,537 | 6/1970 | McFee | 324/60 |
| 3,530,379 | 9/1970 | Demerliac | 324/60 |
| 3,652,929 | 3/1972 | Cushman | 324/51 |
| 3,840,809 | 10/1974 | Yun | 324/158 D |
| 3,943,439 | 3/1976 | Raymond | 324/60 C |
| 4,218,649 | 8/1980 | Kutzavitch | 324/54 |
| 4,337,561 | 7/1982 | Zaengl et al. | 323/208 |
| 4,404,517 | 9/1983 | Machida | 324/57 R |
| 4,481,464 | 11/1984 | Noguchi et al. | 324/57 |
| 4,509,012 | 4/1985 | Lin | 324/158 |

OTHER PUBLICATIONS

Shatzkes et al., "Statistics of Breakdown" IBM Journal of Research and Development, vol. 25, May 1981, pp. 167-175.
Maeda et al., "Multi-Frequency LCR Meters Test Components Under Realistic Conditions" Hewlett-Packard Journal, vol. 30, No. 2, pp. 24-31, Feb. 1979.
Hashimoto et al., "An Automatic Wide-Range Digital LCR Meter," Hewlett-Packard Journal, vol. 28, No. 1, pp. 9-15, Sep. 1976.
Maeda, K. "An Automatic, Precision 1-Mhz Digital LCR Meter," Hewlett-Packard Journal, vol. 25, No. 7, pp. 2-9, Mar. 1974.

Primary Examiner—Reinhard J. Eisenzopf
Assistant Examiner—Jack B. Harvey

[57] ABSTRACT

Test fixtures, each being adapted to receive a capacitor, are connected through a relay network to a time variable high voltage source. Predetermined relays are energized in a predetermined sequence to connect a given capacitor to the source. A high voltage signal having a predetermined waveform is applied to the capacitor associated with an energized relay. When the current through the given capacitor exceeds a threshold, the voltage value then being applied to the capacitor determines the breakdown voltage of the capacitor.

18 Claims, 6 Drawing Sheets

Fig. 3B
Fig. 3A
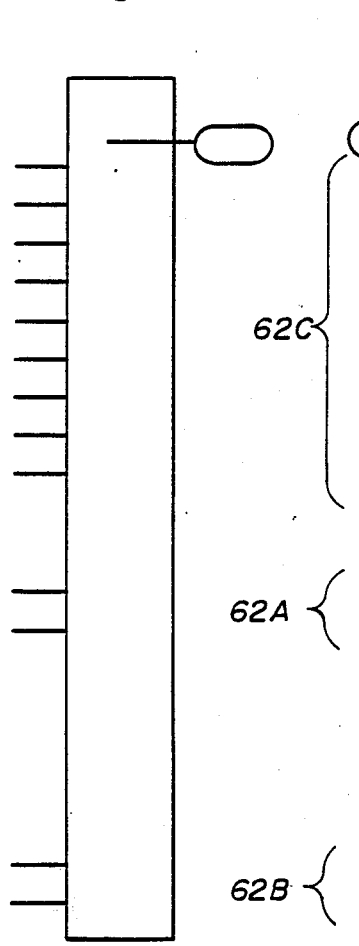
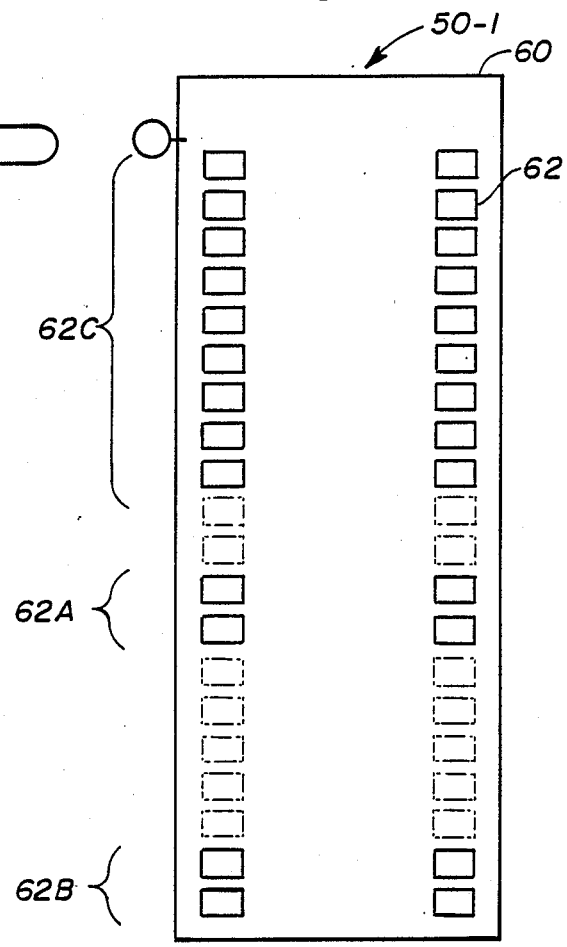

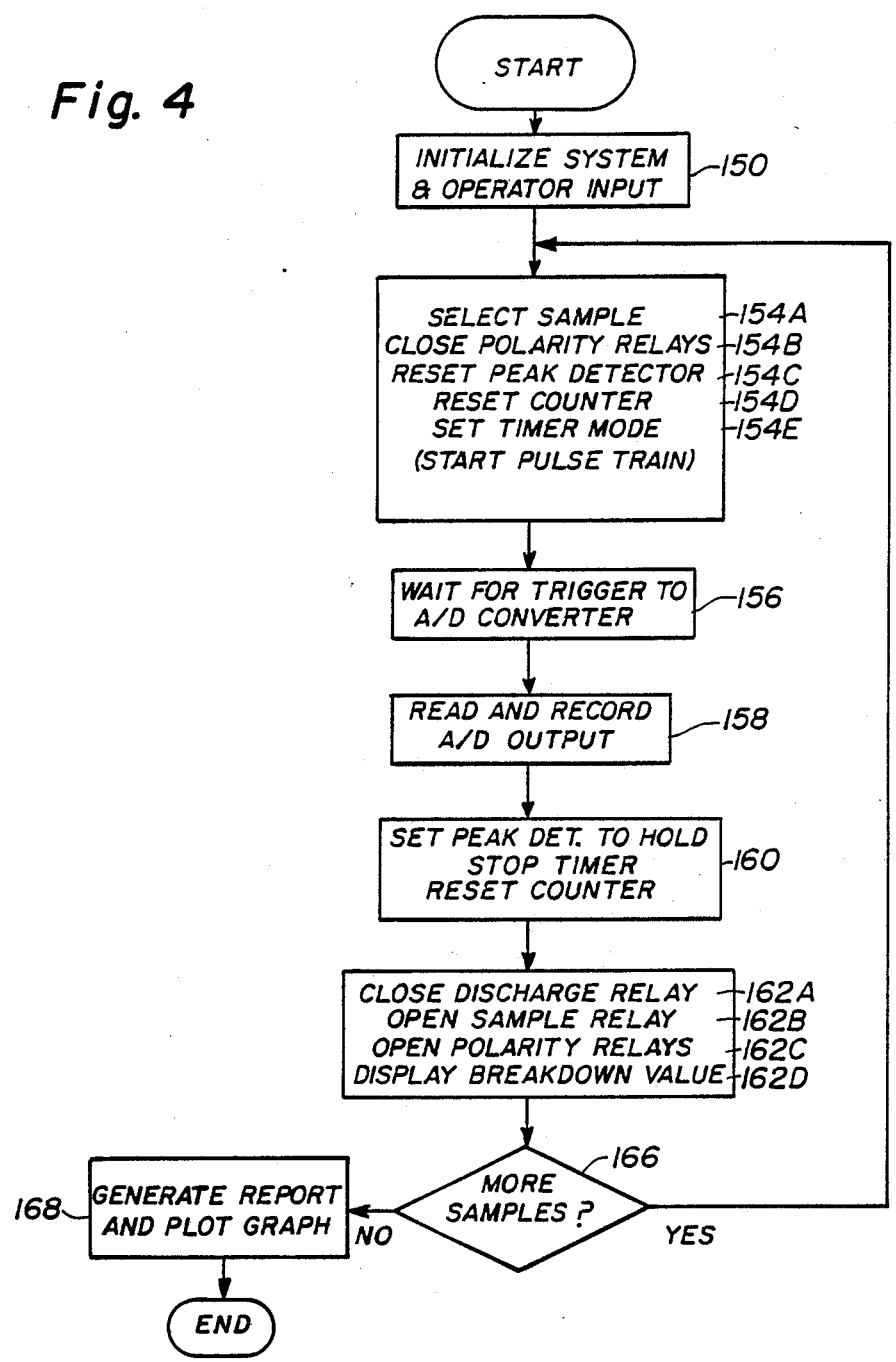

DEVICE FOR AUTOMATICALLY ASCERTAINING CAPACITOR BREAKDOWN VOLTAGE

BACKGROUND OF THE INVENTION

1. Field of the Invention

The present invention relates to an automatic testing device for testing sequentially, under program control, predetermined number of capacitors to ascertain the breakdown voltage of each.

2. Description of the Prior Art

The primary characteristic of a film used as the dielectric in metallized film and/or metal foil/film capacitors is breakdown voltage. That characteristic is a measure of the voltage which, when applied across the film, causes the film to fail. It is not possible to accurately measure this voltage by testing the film in isolation because it is impossible to reproduce the conditions at the metal conductor/film interface that would be present within the finished capacitor structure. Accordingly, to test the dielectric breakdown voltage of the film it is necessary to manufacture a number of capacitors and to test them for breakdown characteristics. From the results of these tests the voltage breakdown characteristics of the film may be implied.

In order to obtain statistically significant results a large number of capacitors should be tested. However, testing capacitors according to present industry practice is a time-consuming and labor intensive process. Accordingly, it is believed advantageous to provide an apparatus which will automatically test each of a plurality of capacitor samples under identical test conditions.

SUMMARY OF THE INVENTION

The present invention relates to an apparatus for automatically measuring the dielectric breakdown voltage characteristics of each one of a plurality of capacitors. The apparatus includes a predetermined number of test fixtures, each test fixture being adapted to receive one of the capacitors to be tested. A relay network, having a plurality of relays therein, is connected such that at least one relay in the relay network is disposed between each test fixture and a time variable high voltage source of electrical potential. Also included in the test apparatus is means for energizing predetermined ones of the relays in accordance with a predetermined sequence thereby to connect the capacitor associated with each relay to the high voltage source. Control means is provided for controlling the output of the voltage source to apply a predetermined high voltage signal having a predetermined waveform associated therewith to each capacitor connected to the source by the energization of a relay.

The apparatus further includes measurement means for measuring the current flowing through the capacitor connected to the high voltage source by the energization of a relay and recording means associated with the measurement means for recording the value of the high voltage when the current flow through the capacitor exceeds a predetermined breakdown current threshold. The recorded value of the high voltage defines the breakdown voltage of the capacitor. In the preferred instance the energizing means, the control means, the measurement means and the recording means are implemented using a digital computer operating in accordance with a program.

Each test fixture is configured from a socket having a body with a first, a second and a third group of receptacles disposed in the body. Each group contains at least one receptacle. A first lead on each capacitor being tested is receivable by a receptacle in either the first or the second group of receptacles and a second lead on the capacitor is receivable by a receptacle in the third group. The first receptacle group is connected to a first, high voltage range, transient suppression device, while the second receptacle group is connected to a second, lower voltage range, transient suppression device. The third receptacle group is connected to the relay associated with the test fixture. Both the first and the second transient suppression devices are substantially resistive elements which are physically mounted on the body of the socket in predetermined close proximity to the first and second receptacle groups, respectively.

BRIEF DESCRIPTION OF THE DRAWINGS

The invention will be more fully understood from the following detailed description thereof, taken in connection with the accompanying drawings, which form a part of this application and in which:

FIGS. 3A, 3B and 3C, 3D are, respectively, a plan and side elevational views of the physical structure of the two pieces of a capacitor test socket assembly for use in the capacitor testing apparatus of the present invention; and FIG. 4 is a flow diagram of the operation of the automatic capacitor testing apparatus in accordance with the present invention.

DETAILED DESCRIPTION OF THE INVENTION

Figure 1:
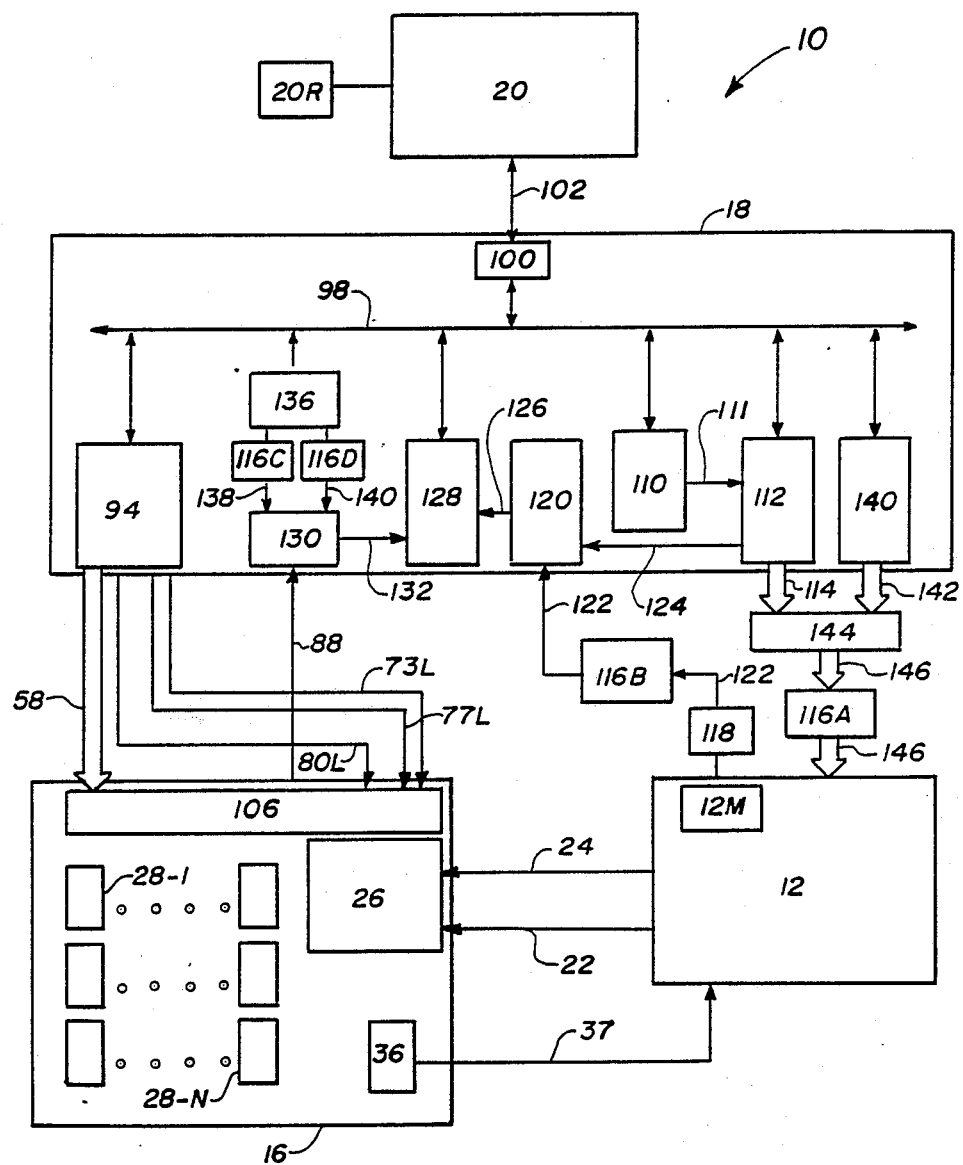
FIG. 1 is a system block diagram of the automatic capacitor testing apparatus in accordance with the present invention.

Throughout the following detailed description similar reference characters refer to similar elements in all figures of the drawings.

An Appendix A (hereafter referred to as Appendix) containing a listing of a computer program in HP Basic language is appended to this application following the specification preceding the claims. The Appendix forms part of this application.

With reference to FIG. 1 shown in a system block diagram of the automatic capacitor testing apparatus generally indicated by reference character 10 in accordance with the present invention. The testing apparatus 10 includes a controllable high voltage source 12 of electrical potential, an N position capacitor holding assembly 16, an interface 18 and a programmable controller 20. The interface 18 is implemented using a card cage such as that manufactured by Hewlett Packard Inc., Palo Alto, Calif. and sold as the model number 6942A multiprogrammer interface. Suitable for use as the controller 20 is the device manufactured by Hewlett Packard Inc., Palo Alto, Calif. and sold under model number HP85.

The source 12 is connected by a high voltage input line 22 and a high voltage ground line 24 to the capacitor holding assembly 16. Suitable for use as the source 12 is a high voltage power supply such as that manufactured and sold by Bertan Company of Syosset, N.Y. and sold as model number 210-05R. The assembly 16 contains an interconnection network generally indicated by reference numeral 26 and a predetermined number N of test fixtures 28-1 though 28-N.

Figure 2A:
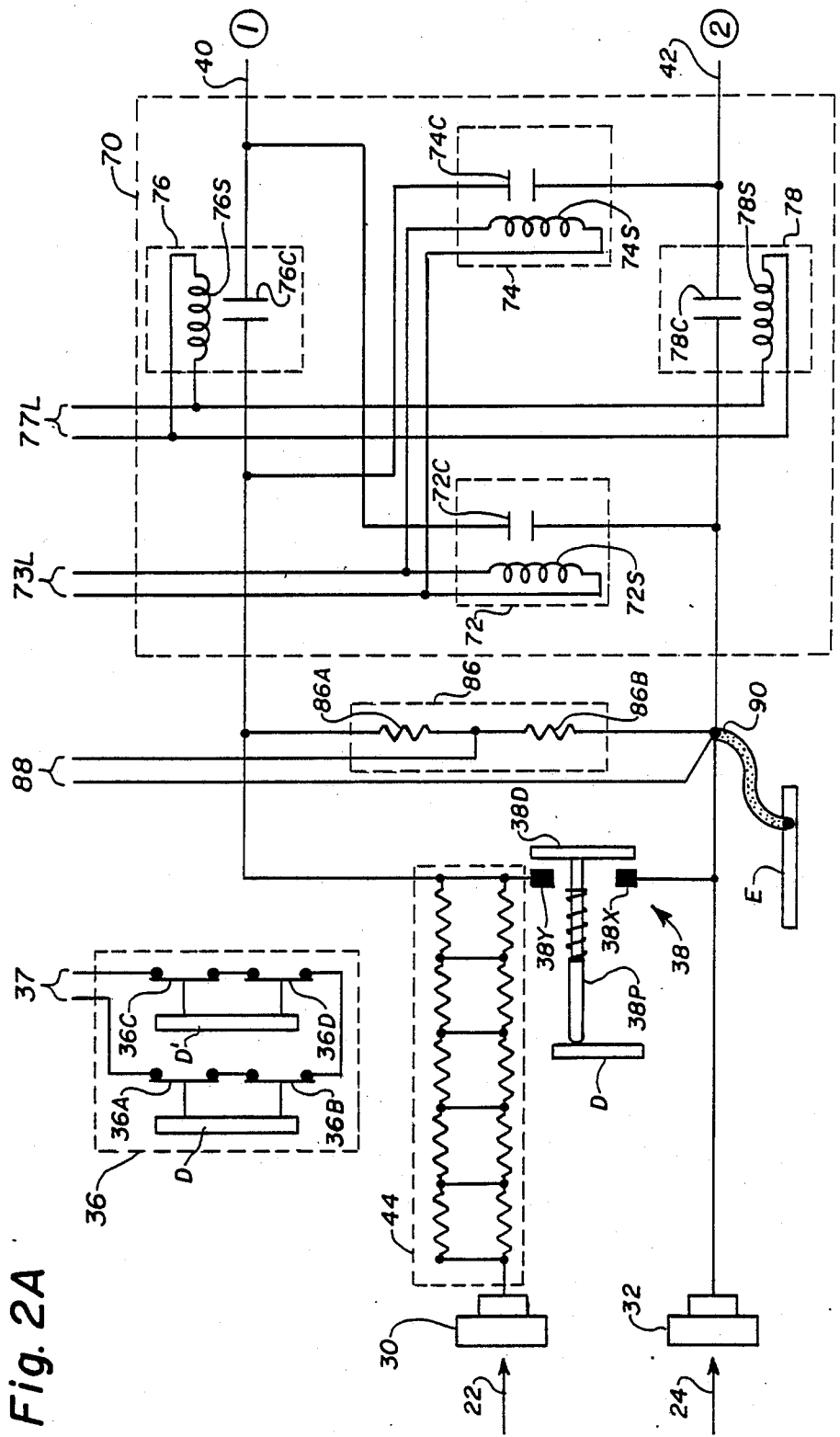
FIGS. 2A, 2B are a schematic diagram of the interconnection circuitry in the capacitor holding assembly used in the capacitor testing apparatus of the present invention.
Figure 2B:
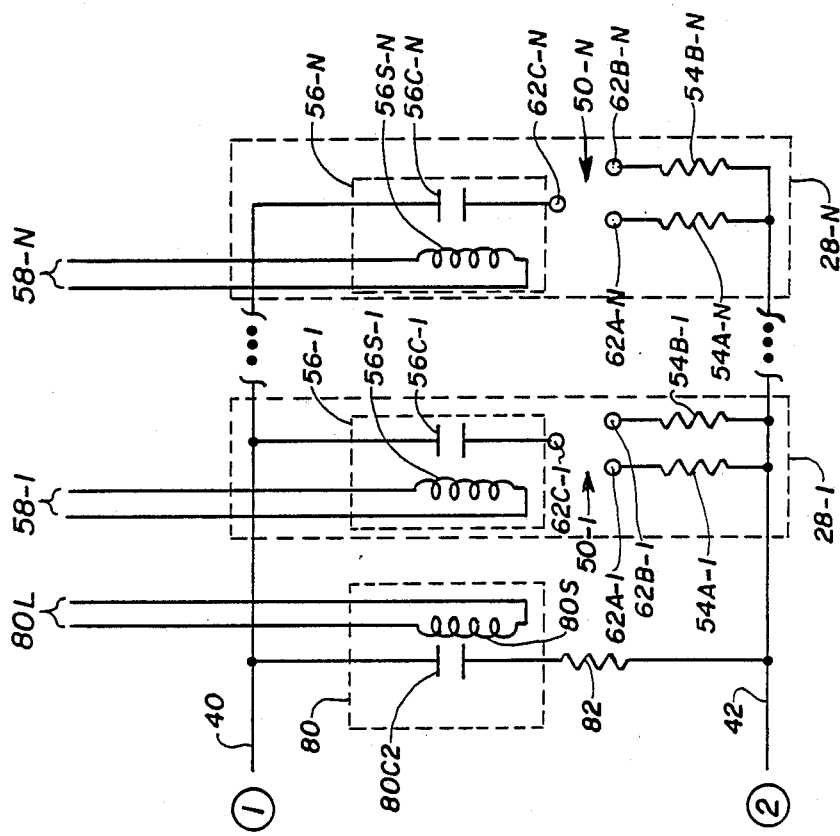

As may be understood from FIGS. 2A and 2B, the lines 22 and 24 are connected by jacks 30, 32 to a high voltage bus 40 and a ground bus 42. The capacitor holding assembly 16 is mounted within a metal enclosure, a portion of which is diagrammatically indicated by the reference character E. The enclosure E is provided with a front access door diagrammatically indicated by the reference character D and a rear access door indicated by the reference character D'. The enclosure E having the doors D and D' therein may be formed by any suitable construction well within the skill of the art or any commercially available electrical box may be used. A door interlock switch 36 and a door actuated high voltage bus shorting switch 38 are both physically mounted within the metal enclosure E. The important functional interaction to note is the interaction between the doors and the switches 36, 38.

The interlock switch 36 is implemented using four microswitches 36A, 36B, 36C, 36D which are electrically connected in series to the high voltage enable input over a pair of lines 37. Suitable for use as the switches 36 is the device manufactured by Omron Corp., of Schaumburg, Ill. and sold as model number S-5HL12-IAS-K. the switches 36A, 36B interact with door D such that when door D is closed the switches are closed and the switches 36C, 36D interact with D' in an identical manner. Thus both doors D and D' must be closed causing all four switches 36A, 36B, 36C, 36D to be closed to enable the high voltage power supply. The switch 38 is formed by a pair of contacts 38X, 38Y that are bridged by a contact disc 38D. The disc 38D is connected to the spring loaded plunger 38P that physically engages the door D of the enclosure E. When the door D is closed the plunger 38P causes the disc 38D to disengage from the contacts 38X, 38Y.

When either door D or D' is opened switches 36 open, thereby disabling the high voltage power supply. Upon further opening of the door D the disc 38D engages contacts 38X and 38Y thereby shorting the high voltage bus to ground to prevent an electrical shock hazard to the operator. FIG. 2 depicts the switches 36 in the position they occupy when the doors D and D' are closed and depicts the disc 38D in the position it occupies relative to the contacts 38X, 38Y when the door D is closed.

Connected to the jack 30 is a transient suppression device 44 configured as a resistive network comprises of plural (e.g., ten, each 4K, 2 W) resistors connected in series and parallel to form an effective 10K ohm high wattage resistance. The device 44 is connected in series with the supply 12 to protect the same from transients.

As is seen in FIG. 2 each test fixture 28 is connected between the high voltage bus 40 and the ground bus 42. Each test fixture 28 is adapted to receive one of the capacitors to be tested. Each fixture 28 includes a socket assembly, generally indicated by reference character 50, transient suppression means 54 for suppressing voltage transients, and a relay 56. Each relay 56 includes a pair of contacts 56C and an actuating coil 56S. The coil 56S of each relay 56 is connected over lines 58 extending to the interface 18 as will be described. Suitable for use for each of the relays 56 is the high voltage relay such as that manufactured by Douglas Randall Company from Pawcatuck, Conn., as model number 24HV1A-75. The transient suppression means 54 includes first and second resistive elements 54A and 54B, respectively. It is desirable that the transient suppression means 54 be located in close proximity to the socket assembly 50 to minimize electromagnetic interference effects when capacitor breakdown occurs.

As seen in FIGS. 3A through 3D the socket assembly 50 physically comprises a body portion 60 formed of an insulating material such as glass filled polysulfone. The body portion 60 has a predetermined number of receptacles 62 arranged therein. In the preferred instance the receptacles 62 are arranged in three groupings indicated by the reference characters 62A, 62B and 62C. The resistive element 54A from the transient suppression means 54 is connected to the receptacle 62A while the resistive element 54B is connected to the receptacle 62B. To effect the desired close interconnection the resistive elements 54A, 54B are connected directly to their associated receptacle groups.

Figures 3C, 3D:
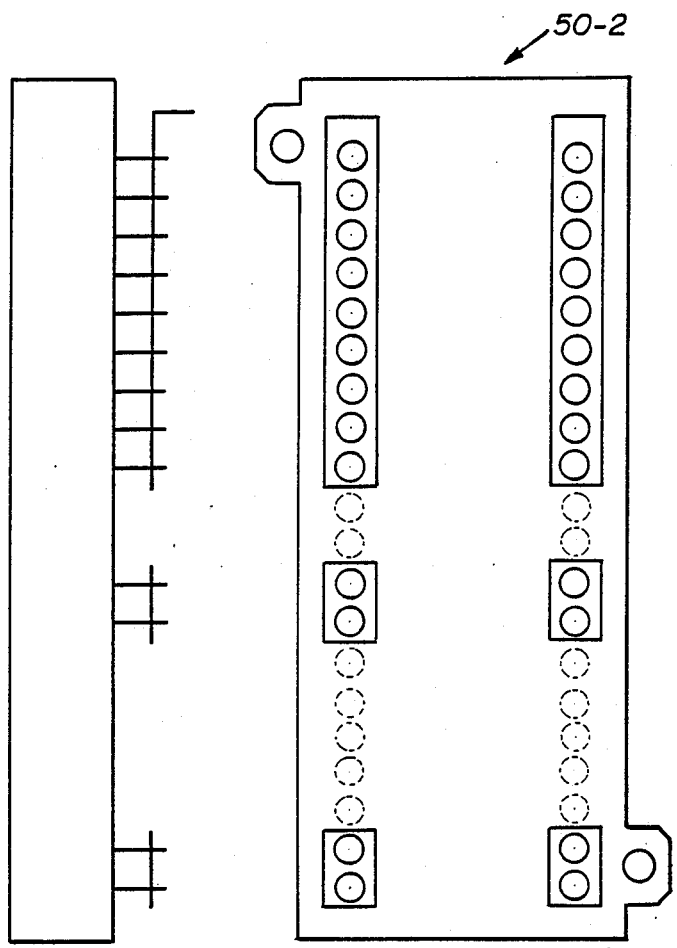

In the preferred case the socket assembly 50 is implemented using a two-piece, zero insertion force, dual in line planar device such as those manufactured and sold by Textool Incorporated, Irving, Tex., respectively under model numbers 240-3346-00-0602 (FIGS. 3A and 3B) and 240-3599-00-0602 (FIGS. 3C and 3D). When the socket assembly 50 is assembled the piece 50-1 shown in FIGS. 3A and 3B is inserted into the piece 50-2 shown in FIGS. 3C and 3D. Each piece 50-1, 50-2 contains dual rows of adjacent receptacles, and thus in the actual implementation the assembly of the two pieces may be used to define a pair of socket assemblies. The pieces 50-1, 50-2 are modified by removing several of the receptacles and associated pins and wiring together the remaining pins to define the receptacle groupings discussed above. This increases the electrical isolation of each receptacle group from the other groups. The openings in the piece from which the receptacles have been removed are filled with a nonconducting polymeric material such as epoxy.

The interconnection network 26 includes a connection and polarity reversing relay network 70 and a discharge relay 80. The network 70 comprises relay pairs 72, 74, and 76, 78. Suitable for use as each of the relays 72, 74, 76 and 78 and as the relay 80 is a high voltage relay such as that manufactured by Douglas Randall Company from Pawcatuck, Conn., as model number 24HV1A-75. Each relay 72, 74, 76, 78 and 80 uses a single contact set C and an actuating coil S. The coil S of the relay pairs 72, 74 and 76, 78 are wired in parallel. Each of the pairs of coils 72S, 74S and 76S, 78S and the coil 80S of the relays is connected to the interface 18 over respective control lines 73L, 77L, and 80L. the network 70 is arranged to apply either a positive polarity high dc voltage or a negative polarity high dc voltage to the bus 40. As used herein, high voltage is meant to denote dc voltages up to five thousand (5000) volts at forty milliamps. The discharge relay 80 is connected in series with a high resistance (on the order of fifty thousand ohms), high wattage (on the order of twenty five watts) resistor 82 to dissipate stored energy remaining across a capacitor in the test fixture and thus provides capacitor discharge means connected across the fixtures for discharging a capacitor previously connected to the high voltage source 12. The leg of the network containing the series connection of both the relay 80 and the resistor 82 is connected across the busses 40, 42 and thus across all of the text fixtures 28. The interconnection network 26 also includes a voltage divider network 86 (approximately 1000 to 1) formed of resistors 86A, 86B to permit monitoring the voltage applied to the bus 40. The output from the divider 86 is applied to the interface 18 over a line 88 (implemented as a shielded two wire cable). The resistor 86B is chassis grounded by a one-half inch copper braid 90 to the wall of the metal enclosure E that houses the capacitor holding assembly 16.

Mounted in the interface 18 is a relay output control arrangement generally indicated by reference character 94. The relay output control 94 includes, in the preferred case, one or more output modules such as those manufactured by Hewlett Packard Inc., Palo Alto, Calif. and sold under model number HP69730A. The relay control 94 is connected to the relay control lines 58 emanating from each of the relays 56 respectively disposed in each of the text fixtures 28 and to the relay control lines 73L, 77L, and 80L. The relay output control 94 is connected to an internal bus 98. The bus 98 is connected through an interface 100 and over a communications bus 102 to the programmable controller 20. The communications bus 102 may be implemented in accordance with IEEE Standard 488. The controller 20 and the relay output control 94 act together to assert the coil 56S associated with a given one of the relays 56 by sending an enabling signal over the control lines 58 associated with the predetermined relay 56. Thus the controller 20 and the relay output control 94 together define means for energizing predetermined ones of the relays in accordance with a predetermined sequence thereby to connect the capacitor associated with each relay to the high voltage source. The control lines 58, 73L, 77L, and 80L pass through an opto-isolator 106. Suitable for use as the opto-isolator is the device manufactured and sold by General Electric Corporation under part number H11B2.

Also mounted in the interface 18 is a timer/pulser module 110 and a counter module 112. Preferred for use as the timer/pulser module 110 is the device manufactured by Hewlett Packard Inc., Palo Alto, Calif. and sold under model number 69736A. The counter module 112 is preferably implemented using the device manufactured by Hewlett Packard and sold under model number HP69775A. The output of the timer 110 is applied to the counter 112 over the line 111. The timer/pulser module 110 and the counter module 112 are connected to the internal bus 98 and, thus, to the programmable controller 20. The output bus 114 from the counter 112 is connected via a T-switch 144, bus 146, and opto-isolator 116A to the high voltage supply 12. Suitable for use as the T-switch is one manufactured and sold by T-bar, Inc. of Wilton, Conn., under part number 5722. Suitable for use as the opto-isolator is the device manufactured and sold by Hewlett Packard under part number 4N46. In a manner to be described the controller 20 together with the timer/pulser 110 and the counter 112 define control means for controlling the output of the voltage source 12 to apply a predetermined high voltage having a predetermined waveform associated therewith to each capacitor connected to the source by the energization of a relay 56.

Also mounted in the interface 18 is a digital output module 140. Preferred for use as the digital output module 140 is the device manufactured by Hewlett Packard Inc., Palo alto, Calif. and sold under model number 69731A. The digital output module 140 is connected to the internal bus 98 and, thus, to the programmable controller 20. The output bus 142 from the digital output module 140 is connected via the T-switch 144, bus 146, and opto-isolator 116A to the high voltage supply 12. In a manner to be described the controller 20 together with the digital output module 140 define alternate control means for controlling the output of the voltage source 12 to apply a predetermined high voltage to each capacitor connected to the source by the energization of a relay 56. This alternate control means is used when the alternative testing protocol (to be described) is implemented.

Within the high voltage supply 2 is a current monitor circuit 12M. The monitor 12M comprises means for monitoring the current flowing through a capacitor connected to the source 12 by the energization of a relay 56. The output of the monitor 12M is a voltage level which is connected to a comparator 118 which is set to a predetermined threshold, typically corresponding to thirty five milliamperes of current from the high voltage current monitor 12M. The digital output from the comparator 118 is connected through opt-isolator 116B, similar to the isolator 116A, to a logic gate 120 over a line 122. The comparator 118 comprises means for detecting when the current flow through the capacitor exceeds a predetermined breakdown current threshold. The gate 120 is preferably implemented using a integrated circuit OR-gate such as that manufactured by Texas Instruments, Inc. and sold as part SN7432. The other input to the gate 120 is derived from the counter overflow line 124 from the counter 112.

The output of the gate 120 is connected over a line 126 to an analog to digital converter 128 such as that manufactured by Hewlett Packard and sold under model number HP 697451A. The converter 128 is connected to the internal bus 98 and thus to the programmable controller 20.

The output line 88 from the voltage divider 86 is applied to a peak detector 130. The detector 130 is preferably implemented using a peak detector monitor manufactured by Burr-Brown, Inc., Phoenix, Ariz. and sold as model 4085. The output of the detector 130 is applied to the converter 128 over a line 132. Command inputs to the detector 130 is derived from a digital output module 136 over lines 138 and 140. The signal on the line 138 controls the operating mode of the detector as either peak detect or hold. The signal on the line 140 resets the detector. The digital output module 136 is connected to the bus 98 and thus, the controller 20. Suitable for use as the module 136 is the device manufactured by Hewlett Packard and sold under model number HP 69731A. Opto-isolators 116C and 116D (similar to the device 116A) are connected in the lines 138 and 140, respectively.

The peak detector 130 and the converter 128 together with the current monitor 12M (coupled through the comparator 118 and the logic gate 120) and the controller 20 cooperates to define voltage measuring means associated with the current monitor for measuring the value of the high voltage when the current flow through the capacitor exceeds a predetermined breakdown current threshold, the value of the high voltage defining the breakdown voltage of the capacitor. The peak detector 130 and the converter 128 measure the value of breakdown voltage to be recorded, while the monitor 12M, the comparator 118 and the logic gate 120 detect the occurrence of the capacitor breakdown and thus assert the measurement. In the embodiment described the value of the breakdown voltage is stored in the memory of the controller 20. Of course, any suitable recording device, indicated diagrammatically at 20R, could be utilized in conjunction with the controller 20. As an example, the device 20R may take the form of a magnetic media recording device, a hardcopy printer, a plotter and/or a CRT display.

The operation of the apparatus heretofore set forth will be explained in the context of a testing multiple capacitors for breakdown voltage. With reference to FIG. 4, at block 150 the operator utilizes the apparatus 10 by energizing the hardware and loading the appropriate program defining the desired test protocol into the controller 20. The details of each of the protocols will be discussed herein.

The basic test protocol uses a single polarity, monotonically increasing applied voltage that is applied to a selected capacitor until voltage breakdown of the dielectric occurs or until the upper voltage limit of the power supply is reached. The operator first manually switches the T-switch 144 to connect the output of the module 112 to the high voltage supply 12. The operator then loads the capacitors to be tested into the appropriate text fixtures 28-1 through 28-N. Not all of the fixtures need be used. The individual capacitors are loaded with one lead of the capacitor inserted into a receptacle in either receptacle group 62A or 62B and other lead into a receptacle in receptacle group 62C. The appropriate receptacle in the particular receptacle group is selected based upon the physical size of the capacitor. Once the capacitors are locked in place, the door D of the enclosure surround the holding assembly 16 is closed, thus allowing the high voltage to appear across the bus 40 and the ground bus 42. The operator provides sample identification and test parameter information. Examples of the former includes sample description, film thickness, and total number of samples under test. Test parameter information includes starting sample number (so that portions of a batch of capacitors can be tested sequentially using the same batch identification), total number of samples, and voltage ramp rate.

Upon the operator's command, the automatic test sequence begins. The alternative protocols are described herein.

Under program control the controller 20 effects the steps outlined in block 154. These steps include selecting the desired one of the capacitors in the appropriate fixture 28-1 through 28-N by closing the corresponding one of the relays 56-1 through 56-N. This is accomplished by the controller 20 sending a command to the relay output control 94 which asserts the appropriate one of the coils 56S in the appropriate relay 56 to connect the fixture between the busses 40, 42.

Next, the polarity of the voltage to be applied is selected by closing the appropriate pair of relays in the relay network 70. This is also effected by a signal from the controller 20 to the relay control module 94, which in turn, asserts the coils of the selected pair of relays 72, 74 or 76, 78.

The controller 20 then commands the output control module 136 to reset the peak detector 130 over the line 140. The controller 20 then commands the module 136 to place the peak detector 130 in the peak detect mode by sending a signal over the line 138.

Next, the controller 20 resets the counter module 112 to zero.

The operating mode of the timer module 110 is then set by the controller 20. By so doing the timer 110 begins to output pulses over the line 111 to the counter module 112. The output of the counter module 112 causes the output of the supply 12 to produce a timer variable high voltage signal. As the counter output increases in value, the value of the high voltage signal applied to the capacitor associated with the energized relay increases commensurately. As noted earlier, in the basic protocol being described, the waveform of the high voltage signal has the shape of a monotonically increasing single polarity staircase. The slope of staircase is governed by the frequency of the pulses from the timer. Whatever the protocol being used the output of the peak detector 130 tracks the high voltage signal and holds the maximum high voltage value if the high voltage signal should decrease. Of course, a decrease would occur at dielectric breakdown.

With reference to block 156 the controller 20 enables the converter 128 to respond to its external trigger input. Upon the onset of dielectric breakdown of the capacitor associated with the energized relay current begins to flow through the capacitor. When the magnitude of the current exceeds the predetermined threshold the converter 128 is triggered by the comparator 118 which senses the output of current monitor circuit 12M. Thus the assertion of the converter 128 occurs in response to the current measurement as sensed by the current monitor 12M. When asserted the converter 128 reads the peak value of the voltage held by the detector 130.

As seen in block 158 when the converter 128 is triggered it applies a signal to the controller 20 which causes the controller to read and to record in its memory the maximum value of the breakdown voltage of the capacitor present at the output of the converter 128.

When breakdown occurs, as shown in block 160, the peak detector 130 is placed in the hold mode (over the line 138), the output pulse train of the timer module 110 is stopped and the counter module 112 is reset to zero. Zeroing the counter module 112 causes the output of the high voltage supply 12 to return to zero. The converter continues to hold the value of the breakdown voltage being held by the peak detector 130. When the source is zeroed current flowing through the capacitor ceases.

As shown at block 162 the coil 80S of the discharge relay 80 is then asserted over the line 80L by the control module 94 in response to the controller 20. After a predetermined delay, to dissipate any remaining charge on the capacitor, the relay 80 is again opened. In addition, the asserted one of the sample relays 56 is deenergized and the polarity control relay pair in the network 70 are also deenergized. The value of the breakdown may, at this point, be printed or displayed on the device 20R.

The sequence of steps 154 through 162 is then repeated for each of the remaining capacitors to be tested, as indicated at the block 166. The example of the code shown in the Appendix test capacitors in banks of sixteen because each of the three digital output modules 94 controlled by the controller 20 in accordance there shown drives sixteen outputs. Upon completion of the testing of all of the total number of samples, the controller 20 formats and generates a report and graph of the test results, as shown at the block 168.

An alternative protocol that may be implemented using an automatic testing arrangement of the present invention is known as a clearing protocol. This is accomplished by first manually switching the T-switch 144 to connect the output of module 140 to the high voltage supply 12. In the clearing protocol the voltage imposed on the selected capacitor (i.e., the capacitor associated with the energized relay 56) is set to a value below the expected breakdown value, removed, and the capacitor discharged. A voltage of the opposite polarity is then applied to the capacitor, removed, and the capacitor discharged. This cycling action stresses the dielectric to a value below that which would cause a catastrophic breakdown. The cycle is repeated, only at a higher voltage in each polarity. Cycling is repeated until a predetermined voltage value (in each polarity) is reached. When subject to the clearing protocol metallized film capacitors will undergo a phenomena known as "clearing" in which internal defects in the dielectric cause a small region of the metallization layer to be removed from around the defect. By limiting the applied voltage this metallization removal can occur without catastrophic failure of the capacitor. This protocol could be readily implemented by appropriate modifications to block 154 (and in particular 154E) of the above described program which would set the magnitude of the applied voltage for each cycle to the desired value by outputting the desired value from module 140. Also during each successive cycle the output form the module 140 is increased (to thereby increase the output voltage for that cycle). The polarity is reversed in a manner similar to that discussed in connection with the block 154 (and in particular 154B).

Another alternate protocol that may be implemented is an alternate clearing protocol wherein the maximum voltage during each cycle is held for a predetermined period of time, typically several seconds to several minutes. This alternate can be implemented using the above described clearing protocol and by adding a waiting period of appropriate duration after the block 154E.

Those skilled in the art, having the benefit of the teachings of the present invention, may effect numerous modifications thereto. It should be understood that such modifications are to be construed as lying within the contemplation of the present invention, as defined by the appended claims.

```
10  ! *** BRKDWN *** 2/4/87 ***
20  !
30  ! 1. Breaksdown capacitors
40  ! 2. Maximum 96 samples
50  ! 3. Alternate spaceing Option
60  ! 4. Graph of distribution
70  !
80  CLEAR
90  OPTION BASE 1
100 DIM A$[10],B$[50],C$[50]
110 DIM P(96),Q(96)
120 FOR I=1 TO 96
130 P(I)=0 @ Q(I)=0
140 NEXT I
150 J1=0 @ J2=0 @ J3=0 @ P1=0 @ P2=0 @ P3=0 @ P4=0
160 X=0 @ I=0 @ K=0 @ Z=0 @ L=0
170 CLEAR 723
180 PRINTER IS 701,80
190 !
200 GOSUB 3620 ! Check Timer
210 GOSUB 3450 ! Sample type
220 GOSUB 460  ! Test Info
230 GOSUB 800  ! 1st Load
240 GOSUB 950  ! Test Start
250 GOSUB 1080 ! Run 1st Batch
260 IF Z=J THEN GOTO 380
270 GOSUB 2210 ! 2nd Load
280 GOSUB 950  ! Test Start
290 GOSUB 1080 ! Run 2nd Batch
300 IF Z=J THEN GOTO 380
310 GOSUB 2210 ! 3rd Load
320 GOSUB 950  ! Test Start
330 GOSUB 1080 ! Run 3rd Batch
340 IF Z=J THEN GOTO 380
350 GOSUB 2210 ! 4th Load
360 GOSUB 950  ! Test Start
370 GOSUB 1080 ! Run 4th Batch
380 !
390 GOSUB 2480 ! Print Table
400 GOSUB 3060 ! Calculate Distribution
410 GOSUB 3960 ! Make Graph
420 GOSUB 2100 ! Test Complete
430 GOSUB 3320 ! Chimes
440 END
```

Lines 200-230: 150

Lines 240-370: 154-162

Lines 390-430: 168

```
450 ! ********************
460 ! TEST INFO................
470 ! ********************
480 DISP @ DISP @ DISP
490 DISP "JOB NUMBER";
500 INPUT A$
510 DISP
520 DISP "SAMPLE DESCRIPTION";
530 INPUT B$
540 DISP
550 DISP "REMARKS";
560 INPUT C$
570 DISP
580 DISP "OPERATOR";
590 INPUT E$
600 DISP
610 DISP "FILM THICKNESS IN MICRONS ('?'IF UNKNOWN)";
620 INPUT F$
630 DISP
640 DISP "RAMP RATE IN VOLTS/SECOND";
650 INPUT R
660 DISP
670 DISP "TOTAL NUMBER OF SAMPLES (MAX. IS 96)";
680 INPUT J
690 IF J>96 THEN GOTO 670
700 IF F$="?" THEN F$="0"
710 L=VAL(F$)
720 L6=100*L ! 100v/u
730 L7=200*L ! 200v/u
740 L6=INT(L6)
750 L7=INT(L7)
760 V=38.15/R
770 CLEAR
780 RETURN
790 ! ********************
800 ! 1ST LOAD................
810 ! ********************
820 DISP @ DISP
830 IF J<48 AND O9=0 THEN 880
840 IF J<24 AND O9=1 THEN GOTO 880
850 IF O9=0 THEN DISP "LOAD 48 SAMPLES"
860 IF O9=1 THEN DISP "LOAD 24 SAMPLES"
870 GOTO 890
880 DISP "LOAD";J;"SAMPLES"
890 DISP ""
900 DISP "PRESS 'CONT' KEY WHEN READY TO TEST"
910 PAUSE
920 CLEAR
930 RETURN
940 ! ********************
950 ! START TEST................
960 ! ********************
970 CLEAR
980 DISP ""
990 DISP "*** TEST IN PROGRESS ***"
1000 DISP ""
1010 ! ENTER 7 ; A,B,C,D,E,F
1020 STATUS 7,1 ; 6
1030 H=SPOLL(723)
1040 OUTPUT 723 ;"SF,1,3,3,1.25,12T"
```

```
1050 OUTPUT 723 ;"OB 15 2,1T"
1060 RETURN
1070 ! ************************
1080 ! RUN TEST................
1090 ! ************************
1100 IF O9=0 THEN GOTO 1120
1110 IF O9=1 THEN GOTO 1140
1120 FOR I=0 TO 15
1130 GOTO 1150
1140 FOR I=1 TO 15 STEP 2                    ─154B
1150 OUTPUT 723 ;"OB 15 1,1T"                 ─154A
1160 OUTPUT 723 ;"OB 12",I,"1T"               ─154C
1170 OUTPUT 723 ;"OP 9,2T"                    ─154D
1180 OUTPUT 723 ;"OP 9,1T"
1190 OUTPUT 723 ;"WC,7,0T"
1200 OUTPUT 723 ;"WF,8.2,1T,OP,8",V,"T"       ─154E

1210 OUTPUT 723 ;"IE 1T"                      ─156
1220 SEND 7 ; UNL MLA TALK 23 SCG 3           ─158
1230 ENTER 7 ; X1
1240 OUTPUT 723 ;"OP 9,3T"                    ─160
1250 OUTPUT 723 ;"WF,8.2,0T"
1260 OUTPUT 723 ;"WC,7,0T"
1270 OUTPUT 723 ;"IP 1T"
1280 SEND 7 ; UNL MLA TALK 23 SCG 1
1290 ENTER 7 ; X
1300 WAIT 5000
1310 OUTPUT 723 ;"OB 15 0,1T"                 ─162A
1320 WAIT 5000
1330 OUTPUT 723 ;"OB 15 0,0T"                 ─162B
1340 OUTPUT 723 ;"OB 12",I,"0T"
1350 OUTPUT 723 ;"OB 15 1,0T"                 ─162C
1360 Z=Z+1
1370 P(Z)=X
1380 DISP "NO.";Z;TAB(10);"BREAKDOWN AT";INT(X);"VOLTS" ─162D
1390 WAIT 2000
1400 IF Z=J THEN 2080                         ─166
1410 NEXT I
1420 ! ...........Bank #2
1430 IF O9=0 THEN GOTO 1450
1440 IF O9=1 THEN GOTO 1470
1450 FOR I=0 TO 15
1460 GOTO 1480
1470 FOR I=1 TO 15 STEP 2
1480 OUTPUT 723 ;"OB 15 1,1T"
1490 OUTPUT 723 ;"OB 13",I,"1T"
1500 OUTPUT 723 ;"OP 9,2T"
1510 OUTPUT 723 ;"OP 9,1T"
1520 OUTPUT 723 ;"WC,7,0T"
1530 OUTPUT 723 ;"WF,8.2,1T,OP,8",V,"T"
1540 OUTPUT 723 ;"IE 1T"
1550 SEND 7 ; UNL MLA TALK 23 SCG 3
1560 ENTER 7 ; X1
1570 OUTPUT 723 ;"OP 9,3T"
1580 OUTPUT 723 ;"WF,8.2,0T"
1590 OUTPUT 723 ;"WC,7,0T"
1600 OUTPUT 723 ;"IP 1T"
1610 SEND 7 ; UNL MLA TALK 23 SCG 1
1620 ENTER 7 ; X
1630 WAIT 5000
```

```
1640 OUTPUT 723 ;"OB 15 0,1T"
1650 WAIT 6000
1660 OUTPUT 723 ;"OB 15 0,0T"
1670 OUTPUT 723 ;"OB 13",I,"0T"
1680 OUTPUT 723 ;"OB 15 1,0T"
1690 Z=Z+1
1700 P(Z)=X
1710 DISP "NO.";Z;TAB(10);"BREAKDOWN AT";INT(X);"VOLTS"
1720 WAIT 2000
1730 IF Z=J THEN 2080
1740 NEXT I
1750 ! ...........Bank #3
1760 IF O9=0 THEN GOTO 1780
1770 IF O9=1 THEN GOTO 1800
1780 FOR I=0 TO 15
1790 GOTO 1810
1800 FOR I=1 TO 15 STEP 2
1810 OUTPUT 723 ;"OB 15 1,1T"
1820 OUTPUT 723 ;"OB 14",I,"1T"
1830 OUTPUT 723 ;"OP 9,2T"
1840 OUTPUT 723 ;"OP 9,1T"
1850 OUTPUT 723 ;"WC,7,0T"
1860 OUTPUT 723 ;"WF,8.2,1T,OP,8",V,"T"
1870 OUTPUT 723 ;"IE 1T"
1880 SEND 7 ; UNL MLA TALK 23 SCG 3
1890 ENTER 7 ; X1
1900 OUTPUT 723 ;"OP 9,3T"
1910 OUTPUT 723 ;"WF,8.2,0T"
1920 OUTPUT 723 ;"WC,7,0T"
1930 OUTPUT 723 ;"IP 1T"
1940 SEND 7 ; UNL MLA TALK 23 SCG 1
1950 ENTER 7 ; X
1960 WAIT 5000
1970 OUTPUT 723 ;"OB 15 0,1T"
1980 WAIT 6000
1990 OUTPUT 723 ;"OB 15 0,0T"
2000 OUTPUT 723 ;"OB 14",I,"0T"
2010 OUTPUT 723 ;"OB 15 1,0T"
2020 Z=Z+1
2030 P(Z)=X
2040 DISP "NO.";Z;TAB(10);"BREAKDOWN AT";INT(X);"VOLTS"
2050 WAIT 2000
2060 IF Z=J THEN 2080
2070 NEXT I
2080 RETURN
2090 ! ************************
2100 ! TEST COMPLETE............
2110 ! ************************
2120 GCLEAR
2130 CLEAR
2140 ALPHA
2150 OUTPUT 723 ;"OB 15 4,1T"
2160 OUTPUT 723 ;"OB 15 2,0T"
2170 DISP @ DISP @ DISP
2180 DISP "**** TEST COMPLETE ****"
2190 RETURN
2200 ! ************************
2210 ! RELOAD..................
2220 ! ************************
2230 J1=J1+1 ! Batch number
```

```
2240 IF O9=0 THEN J2=J1*48
2250 IF O9=1 THEN J2=J1*24
2260 J3=J-J2 ! Number remaining
2270 IF O9=0 THEN GOTO 2300
2280 IF O9=1 AND J3>24 THEN GOTO 2370
2290 !
2300 BEEP @ BEEP @ WAIT 500
2310 BEEP @ BEEP @ WAIT 500
2320 BEEP @ BEEP
2330 DISP @ DISP
2340 DISP "**** RELOAD";J3;"SAMPLES ****"
2350 GOTO 2420
2360 !
2370 BEEP @ BEEP @ WAIT 500
2380 BEEP @ BEEP @ WAIT 500
2390 BEEP @ BEEP
2400 DISP @ DISP
2410 DISP "**** RELOAD 24 SAMPLES ****"
2420 DISP
2430 DISP "PRESS 'CONT' KEY WHEN READY TO TEST"
2440 PAUSE
2450 CLEAR
2460 RETURN
2470 ! ************************
2480 ! PRINT TABLE.............
2490 ! ************************
2500 PRINTER IS 701,80
2510 PRINT "           ****** DUPONT-CRL CAPACITOR BREAKDOWN ******"
2520 PRINT ""
2530 PRINT ""
2540 PRINT "JOB NUMBER: ";A$
2550 PRINT ""
2560 PRINT "SAMPLE DESCRIPTION: ";B$
2570 PRINT ""
2580 PRINT "REMARKS: ";C$
2590 PRINT ""
2600 PRINT "OPERATOR: ";E$;TAB(60);DATE$
2610 PRINT ""
2620 PRINT "RAMP RATE: ";R;"VOLTS/SECOND"
2630 PRINT ""
2640 PRINT "......................................................"
2650 IF VAL(F$)=0 THEN GOTO 2880
2660 PRINT "SAMPLE NO.";TAB(20);"BREAKDOWN,VOLTS";TAB(40);"BREAKDOWN,VOLTS/MICRON"
2670 PRINT "......................................................"
2680 FOR Z=1 TO J
2690 P1=P1+P(Z)
2700 IF P(Z)<L6 THEN P2=P2+1 ! Count samples < 100 V/u
2710 IF P(Z)<L7 THEN P8=P8+1 ! Count samples < 200 V/u
2720 Q(Z)=INT(P(Z)/L)
2730 P(Z)=INT(P(Z))
2740 PRINT TAB(5);Z;TAB(25);P(Z);TAB(47);Q(Z)
2750 NEXT Z
2760 PRINT ""
2770 PRINT "MEAN";TAB(25);INT(P1/J);TAB(47);INT(P1/(L*J))
2780 PRINT ""
2790 IF FP(P2/J*100)>.5 THEN 2810
2800 PRINT "PERCENT < 100 V/M:";TAB(25);CEIL(P2/J*100) @ GOTO 2820
```

```
2810 PRINT "PERCENT < 100 V/M:";TAB(25);INT(P2/J*100)
2820 IF FP(P8/J*100)>.5 THEN 2840
2830 PRINT "PERCENT < 200 V/M:";TAB(25);CEIL(P8/J*100) @ GOTO 2850
2840 PRINT "PERCENT < 200 V/M:";TAB(25);INT(P8/J*100)
2850 PRINT "......................................................................"
2860 !
2870 GOTO 3020
2880 ! .......THICKNESS UNKNOWN...
2890 PRINT "SAMPLE NO.";TAB(40);"BREAKDOWN, VOLTS"
2900 PRINT "......................................................................"
2910 FOR Z=1 TO J
2920 Q(Z)=INT(P(Z))
2930 P1=P1+P(Z)
2940 IF P(Z)>P3 THEN P3=P(Z) ! Maximum Value
2950 IF P(Z)<P4 THEN P4=P(Z)   Minimum Value
2960 P(Z)=INT(P(Z))
2970 PRINT TAB(5);Z;TAB(47);Q(Z)
2980 NEXT Z
2990 PRINT ""
3000 PRINT "MEAN";TAB(47);INT(P1/J)
3010 PRINT "......................................................................"
3020 CLEAR
3030 PRINT CHR$(12)
3040 RETURN
3050 ! *************************
3060 ! CALCULATE DISTRIBUTION...
3070 ! *************************
3080 PRINTER IS 2
3090 PRINT "JOB NO.: ";A$
3100 PRINT
3110 PRINT "SAMPLE:   ";B$
3120 PRINT
3130 PRINT "DATE: ";DATE$
3140 PRINT @ PRINT @ PRINT
3150 PRINT "     % BROKENDOWN"
3160 ! ...REORGANIZE DATA.......
3170 FOR Z=1 TO J
3180 P(Z)=0
3190 NEXT Z
3200 P=100000 @ L=0
3210 FOR M=1 TO J
3220 FOR Z=1 TO J
3230 IF Q(Z)<=P THEN L=Z
3240 IF Q(Z)<=P THEN P=Q(Z)
3250 NEXT Z
3260 P(M)=P
3270 P=1000000
3280 Q(L)=10^6
3290 NEXT M
3300 RETURN
3310 ! *************************
3320 ! CHIMES...................
3330 ! *************************
3340 BEEP 157,50
3350 BEEP 201,50
3360 BEEP 178,50
3370 BEEP 272,75
```

```
3380 WAIT 100
3390 BEEP 272,50
3400 BEEP 178,50
3410 BEEP 157,50
3420 BEEP 201,100
3430 RETURN
3440 ! ************************
3450 ! DETERMINE SAMPLE TYPE....
3460 ! ************************
3470 DISP @ DISP @ DISP
3480 DISP "ARE ALTERNATE POSITIONS USED ?"
3490 ON KEY# 1," NO" GOTO 3540
3500 ON KEY# 4," YES" GOTO 3560
3510 BEEP
3520 KEY LABEL
3530 GOTO 3530
3540 O9=0
3550 GOTO 3570
3560 O9=1
3570 OFF KEY# 1
3580 OFF KEY# 4
3590 CLEAR
3600 RETURN
3610 ! ************************
3620 ! CHECK TIMER.............
3630 ! ************************
3640 IF DATE<87000 THEN GOTO 3650 ELSE RETURN
3650 E1=0 @ E2=0 @ E3=0 @ E4=0
3660 BEEP @ BEEP
3670 DISP @ DISP
3680 DISP "TIMER REQUIRES SETTING"
3690 DISP
3700 DISP "YEAR (eg 87)"
3710 INPUT E1
3720 DISP
3730 DISP "MONTH (eg 12)"
3740 INPUT E2
3750 DISP
3760 DISP "DAY (eg 31)"
3770 INPUT E3
3780 DISP "TIME (eg 1630)"
3790 INPUT E4
3800 IF E2=2 THEN E3=E3+31
3810 IF E2=3 THEN E3=E3+59
3820 IF E2=4 THEN E3=E3+90
3830 IF E2=5 THEN E3=E3+120
3840 IF E2=6 THEN E3=E3+151
3850 IF E2=7 THEN E3=E3+181
3860 IF E2=8 THEN E3=E3+212
3870 IF E2=9 THEN E3=E3+243
3880 IF E2=10 THEN E3=E3+273
3890 IF E2=11 THEN E3=E3+304
3900 IF E2=12 THEN E3=E3+334
3910 IF E2>2 AND FP(E1/4)=0 THEN E3=E3+1
3920 SETTIME 3600*INT(E4/100)+60*FP(E4/100)*100,E1*1000+E3
3930 CLEAR
3940 RETURN
3950 ! ************************
3960 ! GRAPH...................
3970 ! ************************
```

```
3980 IF VAL(F$)>0 THEN S9=4
3990 IF VAL(F$)>0 THEN S8=1
4000 IF VAL(F$)>0 THEN V$="V/U"
4010 IF VAL(F$)>0 THEN GOTO 4080
4020 IF P3<=5000 THEN S9=50
4030 IF P3<=5000 THEN V$="VDC"
4040 IF P3<=2500 THEN S9=25
4050 IF P3<=1000 THEN S9=10
4060 IF P3<=500 THEN S9=5
4070 S8=S9/5
4080 ! OUTLINE................
4090 SCALE 0,S9*100,0,110
4100 XAXIS 8,100*S8,0,S9*100
4110 XAXIS 110,100*S8,0,S9*100
4120 YAXIS 0,10,8,110
4130 YAXIS S9*100,10,8,110
4140 ! LABEL X-AXIS............
4150 FOR X=S8*100 TO (S9-1)*100 STEP S8*100
4160 MOVE X-5*S9,0
4170 LABEL VAL$(X)
4180 NEXT X
4190 MOVE S9*100-S9*10,0
4200 LABEL V$
4210 ! LABEL Y-AXIS............
4220 FOR Y=20 TO 80 STEP 20
4230 MOVE 2.5*S9,Y+6
4240 LABEL VAL$(Y)
4250 NEXT Y
4260 ! PLOT DATA ..............
4270 FOR M=1 TO J
4280 MOVE P(M),INT(100*M/J)+8
4290 LABEL "o"
4300 NEXT M
4310 ! PRINT GRAPH............
4320 COPY
4330 FOR M=1 TO 5
4340 PRINT
4350 NEXT M
4360 RETURN
4370 ! ************************
```

What is claimed is:

1. Apparatus for automatically measuring the dielectric breakdown voltage characteristics of each one of a plurality of capacitors, each capacitor having a first and a second lead, the apparatus comprising:

a time variable high voltage source of electrical potential;

a predetermined number of test fixtures, each test fixture being adapted to receive one of the capacitors to be tested;

a relay network having a plurality of relays therein, at least one relay in the relay network being connected between each test fixture and the high voltage source;

each test fixture comprising:

a socket having a body with a first, a second and a third receptacle disposed in the body, the first lead on each capacitor being receivable by either the first or the second receptacle and the second lead on the capacitor being receivable by the third receptacle, the first receptacle being connected to a first, high voltage range, transient suppression device, the second receptacle being connected to a second lower voltage range, transient suppression device, the third receptacle being connected to the relay associated with the test fixture;

means for energizing predetermined ones of the relays in accordance with a predetermined sequence thereby to connect the capacitor associated with each relay to the high voltage source;

control means for controlling the output of the voltage source to apply a predetermined high voltage having a predetermined waveform associated therewith to each capacitor connected to the source by the energization of a relay;

current monitoring means for monitoring a current flow through the capacitor connected to the source by the energization of a relay; and voltage measuring means associated with the current monitoring means for measuring the value of the high voltage when the current flow through the capacitor exceeds a predetermined breakdown current threshold, the value of the high voltage measured defining the breakdown voltage of the capacitor.

2. The apparatus of claim 1 wherein both the first and the second transient suppression devices are substantially resistive elements.

3. The apparatus of claim 2 wherein the first and the second transient suppression devices are physically mounted on the body of the socket in predetermined close proximity to the first and second receptacles, respectively.

4. The apparatus of claim 1 wherein the first and the second transient suppression devices are physically mounted on the body of the socket in predetermined close proximity to the first and second receptacles, respectively.

5. The apparatus of claim 1 further comprising means for reversing the polarity of the high voltage electrical potential.

6. The apparatus of claim 1 further comprising
a metal housing, each of the test fixtures being mounted in the housing,
a door on the housing,
a door actuating switch connected between the high voltage source and ground potential, the switch being responsive to the opening of the door to prevent an electrical shock hazard to an operator.

7. The apparatus of claim 6 further comprising a high wattage transient suppression device connected in series with the high voltage supply.

8. The apparatus of claim 1 wherein the measuring means comprises a voltage divider connected across all the test fixtures, a peak detector connected to the voltage divider, and an analog to digital converter connected to the peak detector, the converter being responsive to the current monitoring means to convert the maximum value of the voltage divider as detected by the peak detector.

9. The apparatus of claim 1 further comprising capacitor discharge means connected across all of the test fixtures for discharging a capacitor previously connected to the source by the energization of the relay.

10. Apparatus for automatically measuring the dielectric breakdown voltage characteristics of each one of a plurality of capacitors, each capacitor having a first and a second lead, the apparatus comprising:
a time variable high voltage source of electrical potential;
a predetermined number of test fixtures, each test fixture being adapted to receive one of the capacitors to be tested;
a relay network having a plurality of relays therein, at least one relay in the relay network being connected between each test fixture and the high voltage source;
each test fixture comprising:
a socket having a body with a first, a second and a third group of receptacles disposed in the body, each group of receptacles containing at least one receptacle, the first lead on each capacitor being receivable by a receptacle in either the first or the second group and the second lead on the capacitor being receivable by a receptacle in the third group.

each receptacle in the first group being connected to a first, high voltage range, transient suppression device,
each receptacle in the second group being connected to a second, lower voltage range, transient suppression device,
each receptacle in the third group being connected to the relay associated with the test fixture;
means for energizing predetermined ones of the relays in accordance with a predetermined sequence thereby to connect the capacitor associated with each relay to the high voltage source;
control means for controlling the output of the voltage source to apply a predetermined high voltage having a predetermined waveform associated therewith to each capacitor connected to the source by the energization of a relay;
current monitoring means for monitoring a current flow through the capacitor connected to the source by the energization of a relay; and
voltage measuring means associated with the current monitoring means for measuring the value of the high voltage when the current flow through the capacitor exceeds a predetermined breakdown current threshold, the value of the high voltage measured defining the breakdown voltage of the capacitor.

11. The apparatus of claim 10 wherein both the first and the second transient suppression devices are substantially resistive elements.

12. The apparatus of claim 11 wherein the first and the second transient suppression devices are physically mounted on the body of the socket in predetermined close proximity to the first and second groups of receptacles, respectively.

13. The apparatus of claim 10 wherein the first and the second transient suppression devices are physically mounted on the body of the socket in predetermined close proximity to the first and second groups of receptacles, respectively.

14. The apparatus of claim 10 further comprising a metal housing, each of the test fixtures being mounted in the housing,
a door on the housing,
a door actuated switch connected between the high voltage source and ground potential, the switch being responsive to the opening of the door to prevent an electrical shock hazard to an operator.

15. The apparatus of claim 14 further comprising a high wattage transient suppression device connected in series with the high voltage supply.

16. The apparatus of claim 10 further comprising means for reversing the polarity of the high voltage electrical potential.

17. The apparatus of claim 10 wherein the measuring means comprises a voltage divider connected across all the test fixtures, a peak detector connected to the voltage divider, and an analog to digital converter connected to the peak detector, the converter being responsive to the current monitoring means to convert the maximum value of the voltage divider as detected by the peak detector.

18. The apparatus of claim 10 further comprising capacitor discharge means connected across all of the test fixtures for discharging a capacitor previously connected to the source by the energization of the relay.

* * * * *